(12) United States Patent
Cho et al.

(10) Patent No.: US 12,279,499 B2
(45) Date of Patent: Apr. 15, 2025

(54) ORGANIC LIGHT-EMITTING DIODE DISPLAY AND METHOD OF MANUFACTURING THE SAME

(71) Applicant: SAMSUNG DISPLAY CO., LTD., Yongin-si (KR)

(72) Inventors: Youngjin Cho, Yongin-si (KR); Chulkyu Kang, Yongin-si (KR); Yongjae Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/817,195

(22) Filed: Aug. 3, 2022

(65) Prior Publication Data

US 2022/0376033 A1 Nov. 24, 2022

Related U.S. Application Data (63) Continuation of application No. 17/178,529, filed on Feb. 18, 2021, now Pat. No. 11,430,860, which is a
(Continued)

(30) Foreign Application Priority Data

Nov. 23, 2015 (KR) ........................ 10-2015-0163974

(51) Int. Cl.
*H10K 59/131* (2023.01)
*H10K 50/824* (2023.01)
(Continued)

(52) U.S. Cl.
CPC ....... *H10K 59/1315* (2023.02); *H10K 50/824* (2023.02); *H10K 59/122* (2023.02); *H10K 59/1201* (2023.02)

(58) Field of Classification Search
None
See application file for complete search history.

(56) References Cited

U.S. PATENT DOCUMENTS 9,147,724 B2 * 9/2015 Moon .................. H10K 50/824
9,331,131 B2 5/2016 Lee et al.
(Continued)

FOREIGN PATENT DOCUMENTS

JP 2002-318556 10/2002
JP 2008-041297 2/2008
(Continued)

OTHER PUBLICATIONS

A Notice of Allowance issued Sep. 15, 2023 in corresponding Korean Patent Application No. 10-2015-0163974, 2 pages (in Korean).

*Primary Examiner* — Telly D Green
(74) *Attorney, Agent, or Firm* — F. CHAU & ASSOCIATES, LLC (57) ABSTRACT

An organic light-emitting diode (OLED) display and a method of manufacturing the same are disclosed. In one aspect, the display includes a plurality of pixel electrodes positioned over a substrate and separate from each other, a plurality of auxiliary wirings between the pixel electrodes, a pixel-defining layer over the pixel electrodes except for a central portion of the pixel electrodes and at least a portion of each of the auxiliary wirings, an intermediate layer over the pixel-defining layer and having a plurality of openings formed over the portion of each of the auxiliary wirings, and an opposite electrode positioned over the intermediate layer and facing the pixel electrodes, the opposite electrode electrically contacting the auxiliary wirings via the openings. The auxiliary wirings extend in a first direction and separate
(Continued)

from each other by a first distance. The openings are aligned in a diagonal direction crossing the first direction.

21 Claims, 9 Drawing Sheets

Related U.S. Application Data continuation of application No. 16/417,129, filed on May 20, 2019, now Pat. No. 10,950,683, which is a continuation of application No. 15/360,840, filed on Nov. 23, 2016, now Pat. No. 10,297,656.

(51) Int. Cl.
    *H10K 59/122*     (2023.01)
    *H10K 59/12*     (2023.01)

(56) References Cited

U.S. PATENT DOCUMENTS

| | | | |
|---|---|---|---|
| 9,349,784 B2 | 5/2016 | Lee et al. | |
| 9,431,469 B2 | 8/2016 | Park et al. | |
| 9,450,039 B2 | 9/2016 | Jeong et al. | |
| 10,297,656 B2 | 5/2019 | Cho et al. | |
| 10,950,683 B2 | 3/2021 | Cho et al. | |
| 2005/0099369 A1 | 5/2005 | Lee | |
| 2005/0236629 A1 | 10/2005 | Lee et al. | |
| 2011/0215712 A1 | 9/2011 | Hong | |
| 2012/0146030 A1 | 6/2012 | You et al. | |
| 2013/0032803 A1 | 2/2013 | Moon et al. | |
| 2013/0270256 A1 | 10/2013 | Park et al. | |
| 2014/0183479 A1* | 7/2014 | Park | H10K 59/1315 438/34 |
| 2014/0319479 A1 | 10/2014 | Park et al. | |
| 2014/0346460 A1 | 11/2014 | Kang et al. | |
| 2014/0353633 A1 | 12/2014 | Lee et al. | |
| 2014/0374732 A1* | 12/2014 | Jeong | H10K 59/80522 438/34 |
| 2015/0144922 A1* | 5/2015 | Moon | H10K 59/131 257/40 |
| 2015/0214284 A1 | 7/2015 | Kim | |
| 2015/0357382 A1 | 12/2015 | Chung et al. | |
| 2016/0035813 A1 | 2/2016 | Lee et al. | |
| 2016/0093680 A1* | 3/2016 | Paek | H10K 50/805 438/34 |
| 2016/0351116 A1 | 12/2016 | Sun | |
| 2017/0148865 A1 | 5/2017 | Cho et al. | |
| 2017/0358640 A1 | 12/2017 | Park et al. | |
| 2019/0273126 A1 | 9/2019 | Cho et al. | |
| 2021/0175319 A1 | 6/2021 | Cho et al. | |

FOREIGN PATENT DOCUMENTS

| | | | |
|---|---|---|---|
| JP | 2015-050051 | 3/2015 | |
| JP | 2015-50046 | 3/2016 | |
| KR | 10-2005-0045730 | 5/2005 | |
| KR | 10-2005-0099027 | 10/2005 | |
| KR | 10-2014-0141529 | 12/2014 | |
| KR | 10-2015-0054125 | 5/2015 | |
| KR | 20150054125 A * | 5/2015 | H01L 51/203 |

\* cited by examiner

ORGANIC LIGHT-EMITTING DIODE DISPLAY AND METHOD OF MANUFACTURING THE SAME

CROSS-REFERENCE TO RELATED APPLICATION

This application claims the benefit of Korean Patent Application No. 10-2015-0163974, filed on Nov. 23, 2015 in the Korean Intellectual Property Office, U.S. patent application Ser. No. 15/360,840 filed on Nov. 23, 2016, now U.S. Pat. No. 10,297,656 issued May 21, 2019, U.S. patent application Ser. No. 16/417,129 filed on May 20, 2019, and U.S. patent application Ser. No. 17/178,529 filed on Feb. 18, 2021, the disclosures of which are incorporated by reference herein in their entirety.

BACKGROUND

Field

The described technology generally relates to an organic light-emitting diode display and a method of manufacturing the same.

Description of the Related Technology

In general, an organic light-emitting diode (OLED) display includes a matrix of pixels each having an OLED. The OLED includes a pixel electrode, an opposite electrode facing the pixel electrode, and an intermediate layer between the pixel electrode and the opposite electrode and including an emission layer. In such an OLED display, pixel electrodes have island shapes formed by patterning each pixel, and an opposite electrode is provided as one body with respect to the pixels. In typical OLED displays, a voltage (IR) drop occurs in the opposite electrode, and thus, the pixels have unintended brightness differences relative to each other.

SUMMARY OF CERTAIN INVENTIVE ASPECTS

One inventive aspect relates to an OLED display that is easy to manufacture and has high emission stability and a method of manufacturing the OLED display that is easy to manufacture and has high emission stability, so as to solve problems including the problem described above. However, this is only an example, and does not pose a limitation on the scope of the inventive concept.

Another aspect is an OLED display that includes: a plurality of pixel electrodes above a substrate and separate from each other; a plurality of auxiliary wirings between the pixel electrodes, the auxiliary wirings extending in a first direction and separate from each other by a first distance; a pixel-defining layer on the pixel electrodes and exposing at least a portion of the pixel electrodes that includes a central portion of the pixel electrodes and at least a portion of the auxiliary wirings; an intermediate layer on the pixel-defining layer and including a plurality of openings that expose at least a portion of each of the auxiliary wirings and are in a diagonal direction crossing the first direction; and an opposite electrode on the intermediate layer and facing the pixel electrodes, the opposite electrode electrically contacting the auxiliary wirings via the openings.

In the present embodiment, a portion of the intermediate layer that is adjacent to the openings is transformed by strong heat.

In the present embodiment, the auxiliary wirings includes a first auxiliary wiring and a second auxiliary wiring separate from the first auxiliary wiring by a second distance, the openings may include a first opening that exposes at least a portion of the first auxiliary wiring and a second opening that exposes at least a portion of the second auxiliary wiring, and the first opening and the second opening may shift in the diagonal direction.

In the present embodiment, the second distance is identical to the first distance.

In the present embodiment, the second distance is n times the first distance.

In the present embodiment, the openings further include a third opening and a fourth opening that are most adjacent to the first opening and the second opening respectively in a second direction perpendicular to the first direction, and a shape obtained by connecting vertices of the first opening, the second opening, the third opening, and the fourth opening to each other may be a parallelogram.

In the present embodiment, the apparatus further includes an emission layer between the pixel electrodes and the opposite electrode, the emission layer corresponding to each of the pixel electrodes.

In the present embodiment, the apparatus further includes a plurality of sub-wirings extending in a second direction perpendicular to the first direction.

In the present embodiment, the auxiliary wirings and the sub-wirings are electrically connected to each other via contact holes.

Another aspect is a method of manufacturing an OLED display. The method includes: forming a plurality of pixel electrodes above a substrate, the pixel electrodes being separate from each other; forming a plurality of auxiliary wirings between the pixel electrodes, the auxiliary wirings extending in a first direction and separate from each other by a first distance; forming a pixel-defining layer on the pixel electrodes, the pixel-defining layer exposing at least a portion of the pixel electrodes that includes a central portion of the pixel electrodes and at least a portion of the auxiliary wirings; forming an intermediate layer over the entire surface of the substrate, the intermediate layer covering the pixel-defining layer; forming a plurality of openings in the intermediate layer that expose at least a portion of each of the auxiliary wirings and are in a diagonal direction crossing the first direction; and forming, on the intermediate layer, an opposite electrode that faces the pixel electrodes, the opposite electrode electrically contacting the auxiliary wirings via the openings.

In the present embodiment, the forming of the openings includes forming the openings by irradiating a laser beam on the intermediate layer.

In the present embodiment, the forming of the auxiliary wirings includes forming a first auxiliary wiring and forming a second auxiliary wiring separate from the first auxiliary wiring by a second distance, the forming of the openings may include forming a first opening that exposes at least a portion of the first auxiliary wiring and forming a second opening that exposes at least a portion of the second auxiliary wiring, and the first opening and the second opening may shift in the diagonal direction.

In the present embodiment, the second distance is identical to the first distance.

In the present embodiment, the second distance is n times the first distance.

In the present embodiment, the forming of the openings includes forming a third opening that is most adjacent to the first opening in a second direction perpendicular to the first direction and forming a fourth opening that is most adjacent to the second opening in the second direction perpendicular to the first direction, and a shape obtained by connecting vertices of the first opening, the second opening, the third opening, and the fourth opening to each other may be a parallelogram.

In the present embodiment, the method further includes forming an emission layer between the pixel electrodes and the opposite electrode, the emission layer corresponding to each of the pixel electrodes.

These general and specific embodiments may be implemented by using a system, a method, a computer program, or a combination thereof.

An organic light-emitting diode (OLED) display comprising: a substrate; a plurality of pixel electrodes positioned over the substrate and separate from each other; a plurality of auxiliary wirings between the pixel electrodes, the auxiliary wirings extending in a first direction and separate from each other by a first distance; a pixel-defining layer over the pixel electrodes except for a central portion of the pixel electrodes and at least a portion of each of the auxiliary wirings; an intermediate layer over the pixel-defining layer and having a plurality of openings formed over the portion of each of the auxiliary wirings, wherein the openings are aligned in a diagonal direction crossing the first direction; and an opposite electrode positioned over the intermediate layer and facing the pixel electrodes, the opposite electrode electrically contacting the auxiliary wirings via the openings.

In the above display, a portion of the intermediate layer that is adjacent to the openings is configured to be transformed by heat.

In the above display, the auxiliary wirings comprise a first auxiliary wiring and a second auxiliary wiring separate from the first auxiliary wiring by a second distance, wherein the openings comprise a first opening formed over at least a portion of the first auxiliary wiring and a second opening formed over at least a portion of the second auxiliary wiring.

In the above display, the second distance is the same as the first distance.

In the above display, the second distance is n times longer than the first distance, and wherein n is a natural number.

In the above display, the openings further comprise a third opening and a fourth opening that are respectively located closest to the first opening and the second opening in a second direction crossing the first direction, wherein the first to fourth openings have a parallelogram shape.

The above display further comprises an emission layer between the pixel electrodes and the opposite electrode.

The above display further comprises a plurality of sub-wirings extending in a second direction crossing the first direction.

In the above display, the auxiliary wirings and the sub-wirings are electrically connected to each other via a plurality of contact holes.

Another aspect is a method of manufacturing an organic light-emitting diode (OLED) display, the method comprising: forming a plurality of pixel electrodes over a substrate, the pixel electrodes being separate from each other; forming a plurality of auxiliary wirings between the pixel electrodes, the auxiliary wirings extending in a first direction and separate from each other by a first distance; forming a pixel-defining layer over the pixel electrodes except for a central portion of the pixel electrodes and at least a portion of each of the auxiliary wirings; forming an intermediate layer over the entire surface of the substrate, the intermediate layer covering the pixel-defining layer; forming a plurality of openings in the intermediate layer that respectively expose at least a portion of each of the auxiliary wirings, wherein the openings are aligned in a diagonal direction crossing the first direction; and forming an opposite electrode that faces the pixel electrodes over the intermediate layer, the opposite electrode electrically contacting the auxiliary wirings via the openings.

In the above method, the forming of the openings comprises irradiating a laser beam on the intermediate layer.

In the above method, the forming of the auxiliary wirings comprises forming a first auxiliary wiring and forming a second auxiliary wiring separate from the first auxiliary wiring by a second distance, wherein the forming of the openings comprises forming a first opening that exposes at least a portion of the first auxiliary wiring and forming a second opening that exposes at least a portion of the second auxiliary wiring.

In the above method, the second distance is to the same as the first distance.

In the above method, the second distance is n times longer the first distance, and wherein n is a natural number.

In the above method, the forming of the openings comprises i) forming a third opening that is located closest to the first opening in a second direction crossing the first direction and ii) forming a fourth opening that is located closest to the second opening in the second direction and wherein the first to fourth openings have a parallelogram shape.

The above method further comprises forming an emission layer between the pixel electrodes and the opposite electrode.

Another aspect is an organic light-emitting diode (OLED) display comprising: a substrate; a plurality of pixel electrodes formed over the substrate; a plurality of auxiliary wirings between the pixel electrodes, the auxiliary wirings extending in a first direction; an intermediate layer formed over the auxiliary wirings and having a plurality of openings formed therethrough; and an opposite electrode formed over the intermediate layer and electrically connected to the auxiliary wirings via the openings.

In the above display, the auxiliary wirings include first and second auxiliary wirings adjacent to each other, wherein the openings include first and second openings respectively formed over the first and second auxiliary wirings, and wherein the first and second openings are not aligned in a second direction perpendicular to the first direction.

In the above display, the auxiliary wirings further include third and fourth auxiliary wirings adjacent to each other, wherein the third and fourth auxiliary wirings are respectively separated from the first and second auxiliary wirings by at least two interposed auxiliary wirings, wherein the openings further include third and fourth openings respectively formed over the third and fourth auxiliary wirings, and wherein the third and fourth openings are not aligned in the second direction.

The above display further comprises a metal layer interposed between and electrically connecting the auxiliary wirings and the opposite electrode.

DETAILED DESCRIPTION OF CERTAIN INVENTIVE EMBODIMENTS

As the described technology allows for various changes and numerous embodiments, exemplary embodiments will be illustrated in the drawings and described in detail in the written description. Advantages and features of one or more exemplary embodiments and methods of accomplishing the same may be understood more readily by reference to the following detailed description of the one or more exemplary embodiments and the accompanying drawings. The described technology may, however, be embodied in many different forms and should not be construed as being limited to the one or more exemplary embodiments set forth herein.

Reference will now be made in detail to exemplary embodiments, examples of which are illustrated in the accompanying drawings. Like reference numerals in the drawings denote like elements, and a repeated description thereof will be omitted. The term "and/or" used herein includes any and all combinations of one or more of the associated listed items.

While such terms as "first" and "second" may be used to describe various components, such components must not be limited to the above terms. The above terms are used only to distinguish one component from another. The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, exemplary embodiments are not limited thereto.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
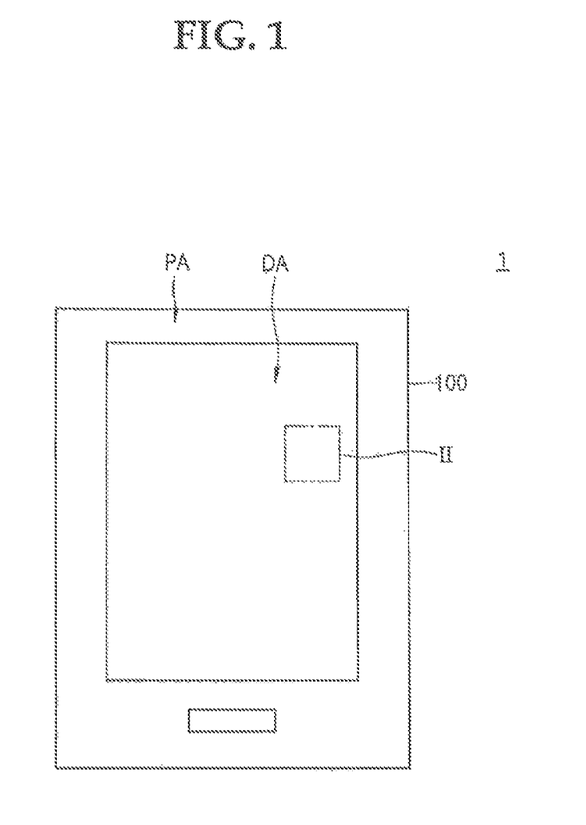
FIG. 1 is a schematic plan view of an OLED display according to an embodiment.
Figure 2:
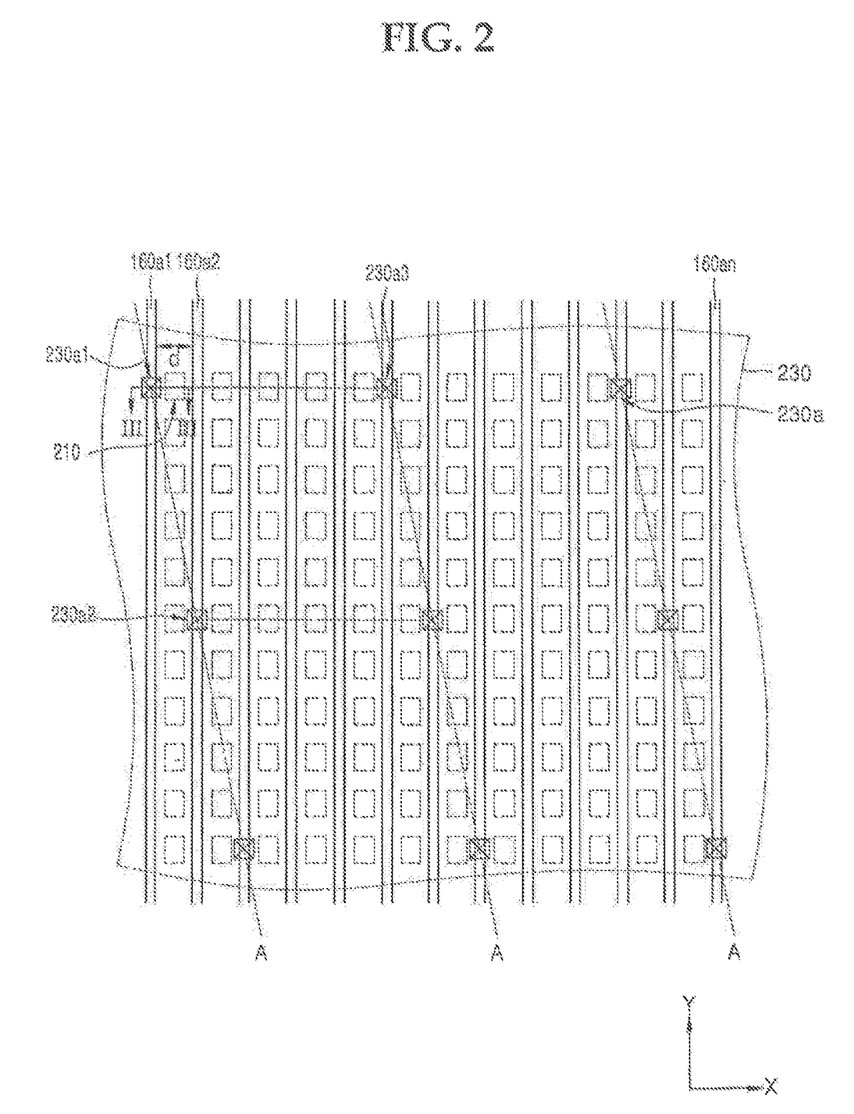
FIG. 2 is an enlarged view of part II of FIG. 1.
Figure 3:
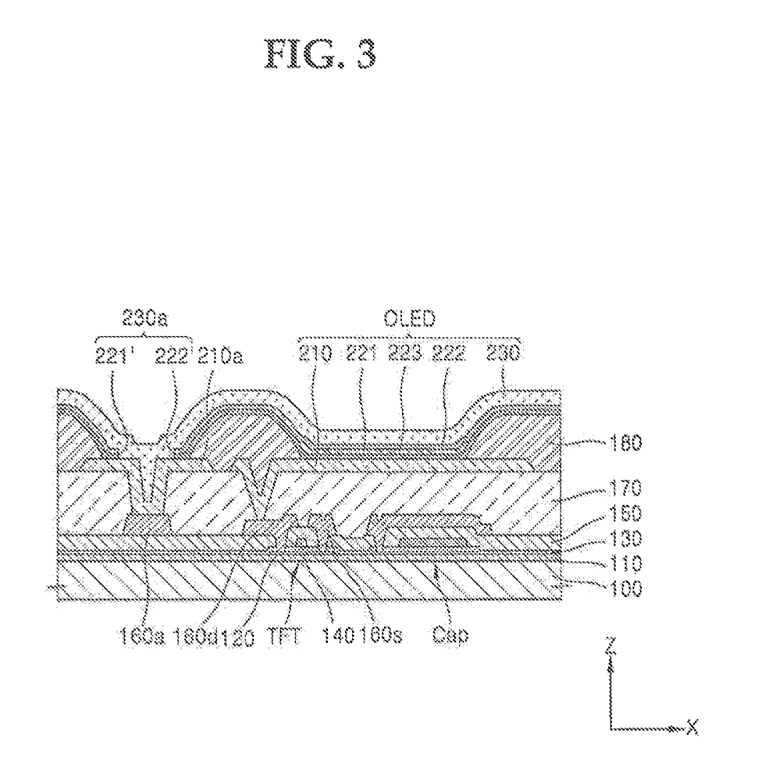
FIG. 3 is a schematic cross-sectional view taken along line III-III of FIG. 2.

FIG. 1 is a schematic plan view of an OLED display 1 according to an embodiment. FIG. 2 is an enlarged view of part II of FIG. 1. FIG. 3 is a schematic cross-sectional view taken along line of FIG. 2.

Referring to FIGS. 1 to 3, the OLED display 1 includes a plurality of pixel electrodes 210 above a substrate 100, a plurality of auxiliary wirings 160a between the pixel electrodes 210, a pixel-defining layer 180 on the pixel electrodes 210, an intermediate layer 221 and 222 including a plurality of openings 230a that expose at least a portion of a plurality of auxiliary wirings 160a1 to 160an, and an opposite electrode 230 electrically contacting the auxiliary wirings 160a1 to 160an via the openings 230a.

The substrate 100 may be formed of one or more materials, for example, glass, metal, or plastic such as polyethylene terephthalate (PET), polyethylene naphthalate (PEN), or polyimide. The substrate 100 may include a display area DA where a plurality of pixels is arranged and a peripheral area PA surrounding the display area DA.

The pixel electrodes 210 may be in the display area DA. The pixel electrodes 210 may be directly on the substrate 100, or over the substrate 100 with various layers including a thin film transistor TFT between the substrate 100 and the pixel electrodes 210. The pixel electrodes 210 may be separate from each other and arranged in a certain direction. That is, as illustrated in FIG. 2, the pixel electrodes 210 may be arranged in x and y directions to form a matrix.

The auxiliary wirings 160a1 to 160an may be between the pixel electrodes 210. The auxiliary wirings 160a1 to 160an are electrically connected to the opposite electrode 230, which will be described below, and thus, decrease an IR drop of the opposite electrode 230. The auxiliary wirings 160a may extend in a first direction (y-axis direction) and may be separate from each other by a first distance d. The auxiliary wirings 160a1 to 160an may be on the same layer as the pixel electrodes 210 or may be on the same layer as one of the electrodes constituting the thin film transistor TFT. In the present embodiment, as illustrated in FIG. 3, the auxiliary wirings 160a may be on the same layer as a source electrode 160s or a drain electrode 160d of the thin film transistor TFT or may be formed of the same material as the source electrode 160s or the drain electrode 160d of the thin film transistor TFT.

The pixel-defining layer 180 may be on the pixel electrodes 210. The pixel-defining layer 180 may expose at least a portion of the pixel electrodes 210 that includes a central portion of the pixel electrodes 210 and at least a portion of the auxiliary wirings 160a1 to 160an. The pixel-defining layer 180 may include an opening that exposes at least a portion of the pixel electrodes 210 that includes a central portion of the pixel electrodes 210, that is, an opening that corresponds to each sub-pixel, and thus may define a pixel. Also, the pixel-defining layer 180 may increase a distance between an end portion of the pixel electrodes 210 and the opposite electrode 230 that will be above the pixel electrodes 210 later and thus may prevent an arc or the like from occurring in the end portion of the pixel electrodes 210.

The intermediate layer 221 and 222 and an emission layer 223 may be on the pixel-defining layer 180. The intermediate layer 221 and 222 may have a single-layered or multi-layered structure, and as illustrated in FIG. 3, may be disposed over the entire surface of the substrate 100. That is, unlike the emission layer 223, the intermediate layer 221 and 222 may entirely cover the top surface of the pixel-defining layer 180. The intermediate layer 221 and 222 may include one or more selected from a hole injection layer (HIL), a hole transport layer (HTL), an electron transport layer (ETL), and an electron injection layer (EIL).

The intermediate layer 221 and 222 may include a first intermediate layer 221 and a second intermediate layer 222. In this regard, the first intermediate layer 221 may include an opening 221', and the second intermediate layer 222 may include an opening 222'. That is, the openings 230a illustrated in FIG. 2 may each include the opening 221' in the first intermediate layer 221 and the opening 222' in the second intermediate layer 222.

The first intermediate layer 221 may have a single-layered or multi-layered structure. For example, when the first intermediate layer 221 is formed of a polymer, the first intermediate layer 221 may include a single HTL, the HTL including poly-(3,4)-ethylene-dihydroxy thiophene (PEDOT) or polyaniline (PANI). When the first intermediate layer 221 is formed of a low molecular material, the first intermediate layer 221 may include an HIL and an HTL.

The second intermediate layer 222 may be optionally formed. For example, when the first intermediate layer 221 and the emission layer 223 each include a polymer, the second intermediate layer 222 may be omitted. When the first intermediate layer 221 and the emission layer 223 each include a low molecular material, the second intermediate layer 222 may be formed to obtain an OLED having excellent characteristics. In this case, the second intermediate layer 222 may have a single-layered or multi-layered structure and may include an ETL and/or an EIL.

The intermediate layer 221 and 222 may include the openings 230a exposing at least a portion of the auxiliary wirings 160a1 to 160an. The openings 230a may be in a diagonal direction (direction A) crossing the first direction (y-axis direction) in which the auxiliary wirings 160a1 to 160an extend. Although it is illustrated in FIG. 2 that the openings 230a are provided for every five pixel electrodes 210 each in width and length, the disclosure is not limited thereto. A position in which the openings 230a are repeatedly formed may be changed depending on the size of a display area (active area).

Referring to FIG. 2 again, the auxiliary wirings 160a1 to 160an include a first auxiliary wiring 160a1 and a second auxiliary wiring 160a2 adjacent to the first auxiliary wiring 160a1. The second auxiliary wiring 160a2 may be separate from the first auxiliary wiring 160a1 by a second distance, and in this regard, the second distance may be identical to the first distance d or may be n times the first distance d. That is, when the second distance is identical to the first distance d, the second auxiliary wiring 160a2 may be right next to the first auxiliary wiring 160a1. When the second distance is n times the first distance d, the second auxiliary wiring 160a2 may not be right next to the first auxiliary wiring 160a1.

The openings 230a may include a first opening 230a1 and a second opening 230a2. The first opening 230a1 may expose at least a portion of the first auxiliary wiring 160a1, and the second opening 230a2 may expose at least a portion of the second auxiliary wiring 160a2. In this regard, the first opening 230a1 and the second opening 230a2 may be shifted in the diagonal direction (direction A). Accordingly, the first opening 230a1 and the second opening 230a2 shifted from the first opening 230a1 by a predetermined distance may be above different auxiliary wirings from each other, and as such a pattern is repeated, current may be prevented from concentrating into a certain auxiliary wiring.

The openings 230a may further include a third opening 230a3 and a fourth opening 230a4 in addition to the first opening 230a1 and the second opening 230a2. The third opening 230a3 may be most adjacent to the first opening 230a1 in a second direction (x-axis direction) perpendicular to the first direction (y-axis direction). Similarly, the fourth opening 230a4 may be most adjacent to the second opening 230a2 in the second direction (x-axis direction) perpendicular to the first direction (y-axis direction). In this regard, a shape obtained by connecting respective vertices of the first opening 230a1, the second opening 230a2, the third opening 230a3, and the fourth opening 230a4 may be a parallelogram. That is, when the first opening 230a1 and the third opening 230a3 are parallel to each other in the second direction (x-axis direction), and the second opening 230a2 and the fourth opening 230a4 are also parallel to each other in the second direction (x-axis direction), the second opening 230a2 is shifted from the first opening 230a1 by a predetermined distance in the diagonal direction (direction A), and the fourth opening 230a4 is shifted from the third opening 230a3 by a predetermined distance in the diagonal direction (direction A).

When the first opening 230a1 and the second opening 230a2 are not in the diagonal direction (direction A) but consecutively in the first direction (y-axis direction) along a certain auxiliary wiring, for example, the first auxiliary wiring 160a1, current concentrates into the first auxiliary wiring 160a1. This degrades the performance of an auxiliary wiring formed to lower the IR drop of the opposite electrode 230. Accordingly, in the OLED display 1, when the openings 230a via which the auxiliary wirings 160a1 to 160an and the opposite electrode 230 may electrically contact each other are formed, the openings 230a may be shifted as much as a predetermined distance in the diagonal direction (direction A) and thus may be above different auxiliary wirings from each other. Accordingly, current may be prevented from concentrating into a certain auxiliary wiring.

Next, a cross-sectional structure of the OLED display 1 will be mainly described in the following with reference to FIG. 3.

The thin film transistor TFT and a capacitor CAP may be disposed above the substrate 100, and an OLED electrically connected to the thin film transistor TFT may be placed above the substrate 100. The thin film transistor TFT includes a semiconductor layer 120 formed of amorphous silicon, polycrystalline silicon, or an organic semiconductor material, a gate electrode 140, the source electrode 160s, and the drain electrode 160d. A general structure of the thin film transistor TFT will now be described.

A buffer layer 110 formed of silicon oxide, silicon nitride, or the like may be disposed on the substrate 100 to planarize a surface of the substrate 100 or to prevent impurities or the like from penetrating into the semiconductor layer 120 of the thin film transistor TFT, and the semiconductor layer 120 may be on the buffer layer 110.

The gate electrode 140 may be disposed above the semiconductor layer 120, and according to a signal applied to the gate electrode 140, the source electrode 160s and the drain electrode 160d may be electrically connected to each other. The gate electrode 140 may include a single layer or layers including, for example, one or more materials selected from aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu) by taking into account factors such as adhesiveness to an adjacent layer, surface smoothness of a stacked layer, and processability.

In this regard, in order to secure insulation between the semiconductor layer 120 and the gate electrode 140, a gate insulation layer 130 including silicon oxide and/or silicon nitride may be between the semiconductor layer 120 and the gate electrode 140.

An interlayer insulation layer 150 may be on the gate electrode 140 and may include a single layer or layers formed of a material such as silicon oxide or silicon nitride.

The source electrode 160s and the drain electrode 160d may be on the interlayer insulation layer 150. The source electrode 160s and the drain electrode 160d may each be electrically connected to the semiconductor layer 120 via contact holes in the interlayer insulation layer 150 and the gate insulation layer 130. The source electrode 160s and the drain electrode 160d may include a single layer or layers including, for example, one or more materials selected from aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu) by taking into account a factor such as conductivity.

Although not illustrated, a protective layer (not shown) may be provided to cover the thin film transistor TFT for protection of the thin film transistor TFT having such a structure. The protective layer may be formed of an inorganic material, for example, silicon oxide, silicon nitride, or silicon oxynitride.

A planarization layer 170 may be disposed above the substrate 100. When an OLED is above the thin film transistor TFT, the planarization layer 170 substantially planarizes the top surface of the thin film transistor TFT and protects the thin film transistor TFT and various devices. The planarization layer 170 may be formed of, for example, an acrylic organic material or benzocyclobutene (BCB). In this regard, as illustrated in FIG. 3, the buffer layer 110, the gate insulation layer 130, the interlayer insulation layer 150, and the first planarization layer 170 may be over the entire surface of the substrate 100.

The pixel-defining layer 180 may be disposed above the thin film transistor TFT. The pixel-defining layer 180 may be on the planarization layer 170 and may have an opening. The pixel-defining layer 180 defines a pixel area above the substrate 100. The pixel-defining layer 180 may be, for example, an organic insulation layer. The organic insulation layer may include an acrylic polymer such as poly(methyl methacrylate) (PMMA), polystyrene (PS), a polymer derivative containing a phenol group, an imide-based polymer, an aryl ether-based polymer, an amide-based polymer, a fluorine-based polymer, a p-xylene-based polymer, a vinyl alcohol-based polymer, and a mixture thereof.

The OLED may be on the pixel-defining layer 180. The OLED may include a pixel electrode 210, the emission layer 223, and the opposite electrode 230.

The pixel electrode 210 may be a (semi)transparent electrode or a reflective electrode. When the pixel electrode 210 is a (semi)transparent electrode, the pixel electrode 210 may be formed of, for example, indium tin oxide (ITO), indium zinc oxide (IZO), zinc oxide (ZnO), indium oxide (In$_2$O$_3$), indium gallium oxide (IGO), or aluminum zinc oxide (AZO). When the pixel electrode 210 is a reflective electrode, the pixel electrode 210 may include a reflective layer formed of Ag, Mg, Al, Pt, Pd, Au, Ni, Nd, Ir, Cr, and a compound thereof, and a layer including ITO, IZO, ZnO, In$_2$O$_3$, IGO, or AZO. However, the disclosure is not limited thereto, and the pixel electrode 210 may include various materials. Also, a structure of the pixel electrode 210 may differ, such as a single layer or layers.

The emission layer 223 may be in the pixel area defined by the pixel-defining layer 180 and may be in the middle of the first intermediate layer 221 and the second intermediate layer 222. The first intermediate layer 221 may include an HIL and/or an HTL between the emission layer 223 and the pixel electrode 210, and the second intermediate layer 222 may include an ETL and/or an EIL between the emission layer 223 and the opposite electrode 230. However, the first and second intermediate layers 221 and 222 are not limited thereto and may have various structures.

The opposite electrode 230 covering the first and second intermediate layers 221 and 222 as well as the emission layer 223 and facing the pixel electrode 210 may be disposed over the entire surface of the substrate 100. The opposite electrode 230 may be a (semi)transparent electrode or a reflective electrode.

When the opposite electrode 230 is a (semi)transparent electrode, the opposite electrode 230 may include a layer including metal having a low work function, that is, Li, Ca, LiF/Ca, LiF/Al, Al, Ag, Mg, and a compound thereof, and a (semi)transparent conductive layer including ITO, IZO, ZnO, In$_2$O$_3$, or the like. When the opposite electrode 230 is a reflective electrode, the opposite electrode 230 may include a layer including Li, Ca, LiF/Ca, LiF/Al, Al, Ag, Mg, and a compound thereof. However, a structure and a material of the opposite electrode 230 are not limited thereto and may vary.

Referring to FIG. 3, an auxiliary wiring 160a may be on the same layer as the source electrode 160s and the drain electrode 160d. In this case, the auxiliary wiring 160a does not necessarily have to be on the same layer as the source electrode 160s or the drain electrode 160d. However, when the auxiliary wiring 160a is on the same layer as the source electrode 160s or the drain electrode 160d relatively thicker than other conductive layers, it may be easy to decrease resistance applied to the auxiliary wiring 160a.

The opposite electrode 230 may electrically contact the auxiliary wiring 160a via an opening 230a. Referring to FIG. 3, a material layer 210a may be further disposed between a portion of the opposite electrode 230 that corresponds to the opening 230a and the auxiliary wiring 160a. The material layer 210a may include the same material as the pixel electrode 210 and may be on the same layer as the pixel electrode 210.

The opposite electrode 230 may electrically contact the auxiliary wiring 160a via the opening 230a in the intermediate layer 221 and 222. The opening 230a may be formed by irradiating a laser beam on the intermediate layer 221 and 222, and accordingly, a portion of the intermediate layer 221 and 222 that is adjacent to the opening 230a in the intermediate layer 221 and 222 may be transformed by strong heat. For example, after the intermediate layer 221 and 222 is formed over the entire surface of the pixel-defining layer 180, a laser bean may be irradiated around the auxiliary wiring 160a having at least a portion exposed by the pixel-defining layer 180, and thus, the opening 230a may be formed.

Figure 4:
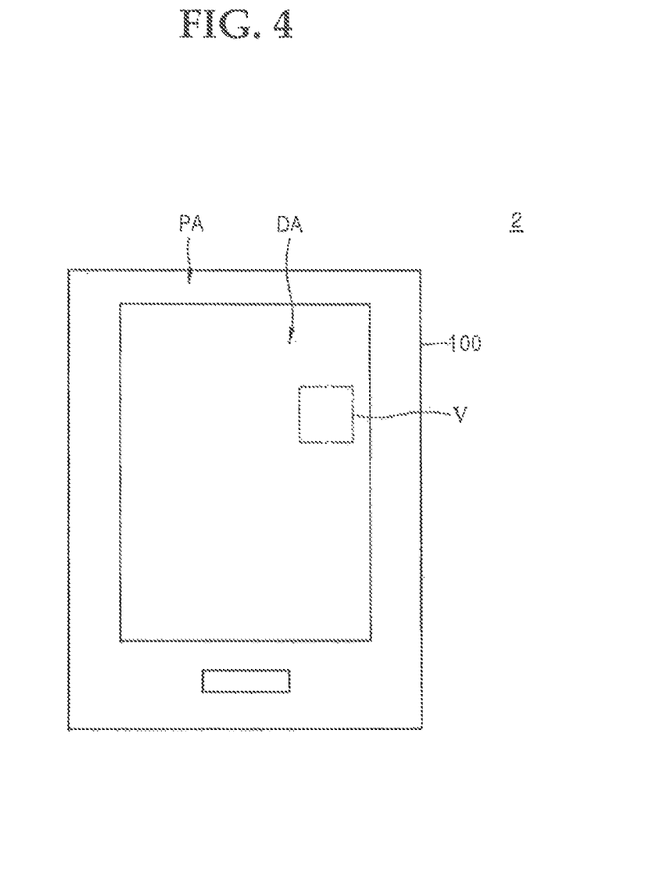
FIG. 4 is a schematic plan view of an OLED display according to an embodiment.
Figure 5:
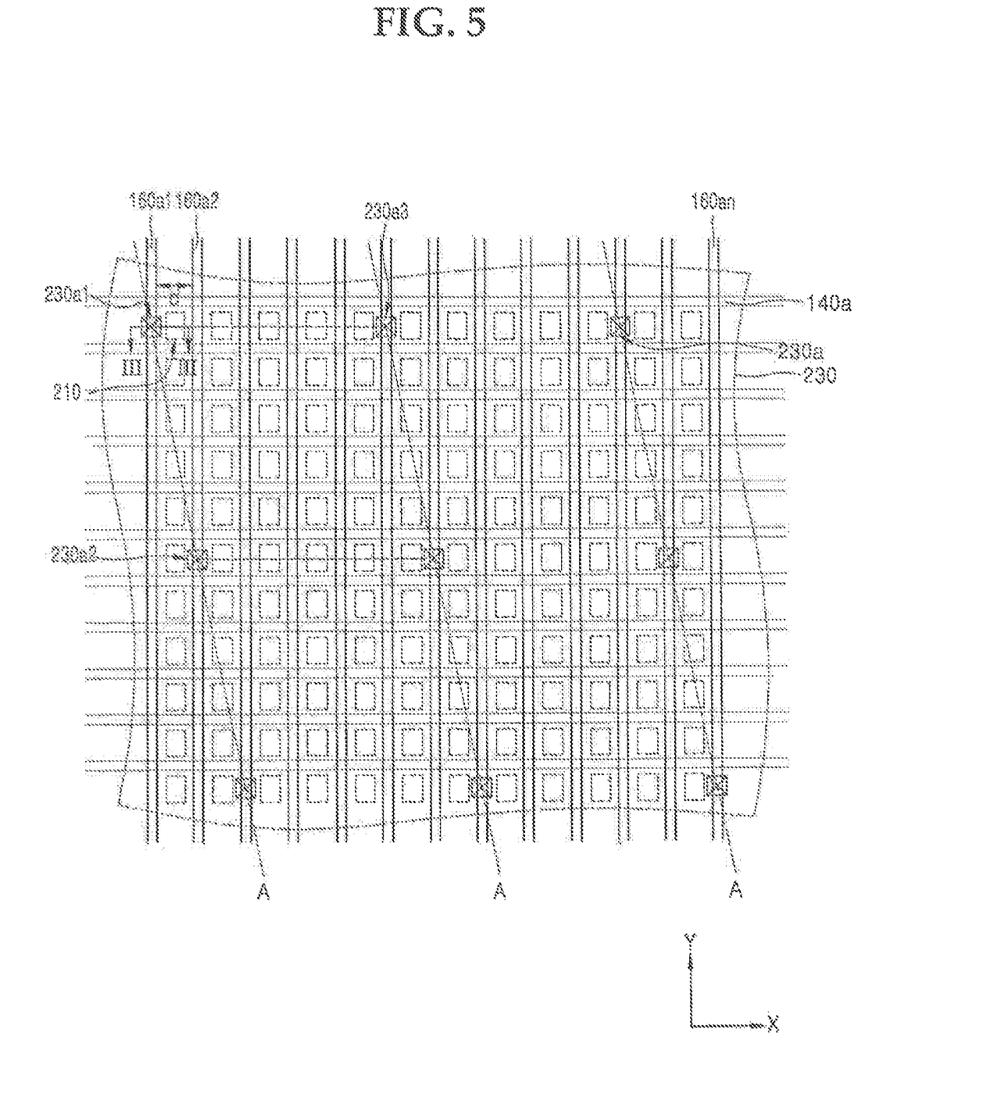
FIG. 5 is an enlarged view of part V of FIG. 4.

FIG. 4 is a schematic plan view of an OLED display 2 according to an embodiment. FIG. 5 is an enlarged view of part V of FIG. 4.

Referring to FIGS. 4 and 5, the OLED display 2 may further include a plurality of sub-wirings 140a disposed perpendicular to the auxiliary wirings 160a1 to 160an. The OLED display 2 in the present embodiment is identical to the OLED display 1 of FIGS. 1 to 3 except that the sub-wirings 140a are additionally provided. Accordingly, the sub-wirings 140a will be mainly described hereinafter, and repeated descriptions thereof will be omitted.

The OLED display 2 may include the sub-wirings 140a. As illustrated in FIG. 5, the sub-wirings 140a may extend in the second direction (x-axis direction) perpendicular to the first direction (y-axis direction). That is, the sub-wirings 140a may cross the auxiliary wirings 160a and thus, may form a mesh shape. The sub-wirings 140a may be electrically connected to the auxiliary wirings 160a via contact holes (not shown) in a position where the sub-wirings 140a cross the auxiliary wirings 160a. Due to the sub-wirings 140a, the amount of current passing through the auxiliary wirings 160a may be easily dispersed. Although not illustrated, the sub-wirings 140a may be on the same layer as one of the electrodes included in the thin film transistor TFT. For example, in the previous embodiment of FIG. 3, the sub-wirings 140a may be on the same layer as the gate electrode 140, and accordingly, the sub-wirings 140a may be formed of the same material as the gate electrode 140.

Although an OLED display according to one or more embodiments has been mainly described above, the disclosure is not limited thereto. For example, a method of manufacturing an OLED display, according to one or more embodiments, is within the scope of the described technology.

FIGS. 6 to 9 are schematic cross-sectional views of a process of manufacturing an OLED display according to an embodiment. Although a plurality of pixels have to be disposed in the display area DA of the substrate 100 in order to manufacture the OLED display according to an embodiment, the manufacturing process will be described with focus on a cross-sectional structure of one pixel with reference to FIGS. 6 to 9.

Figure 6:
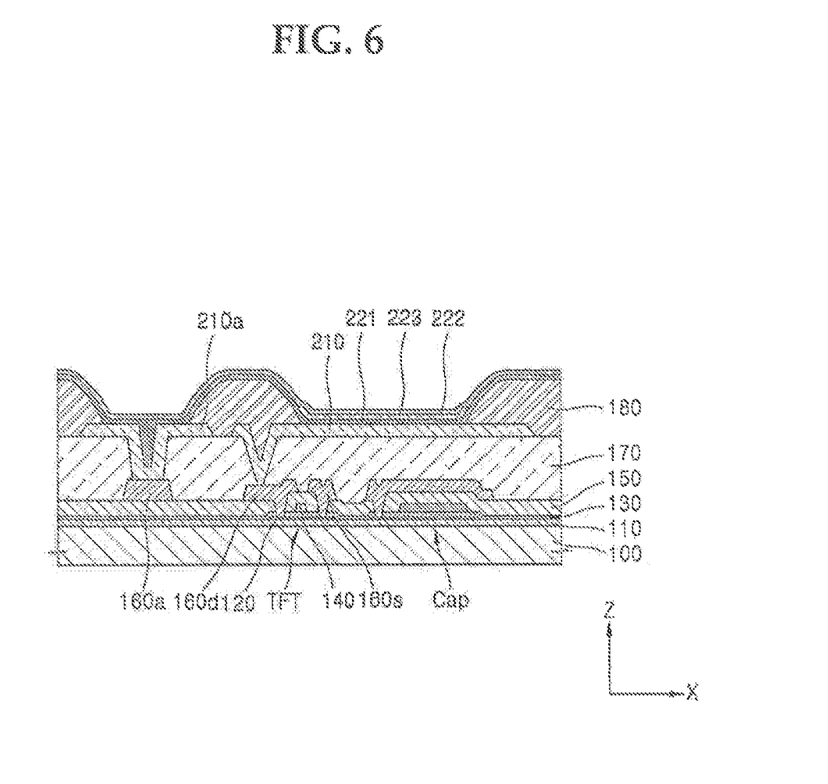
FIGS. 6, 7, 8 and 9 are schematic cross-sectional views of a process of manufacturing an OLED display according to an embodiment.

Referring to FIGS. 2 and 6, the pixel electrodes 210 that are separate from each other are disposed above the substrate 100. Although it is illustrated in FIG. 6 that the pixel electrode 210 is disposed on the planarization layer 170, the disclosure is not limited thereto.

Various layers may be disposed before the pixel electrode 210 is disposed. It is illustrated in FIG. 6 that, after the thin film transistor TFT and the capacitor CAP are disposed above the substrate 100, and the planarization layer 170 covering the thin film transistor TFT and the capacitor CAP is disposed thereon, the pixel electrode 210 is disposed on the planarization layer 170.

In this regard, before the pixel electrodes 210 are disposed, as illustrated in FIG. 2, the auxiliary wirings 160a1 to 160an may be disposed between the pixel electrodes 210 and be separate from each other by a predetermined distance. The auxiliary wirings 160a1 to 160an may extend in the first direction (y-axis direction).

Referring to FIG. 6, the auxiliary wiring 160a is disposed on the same layer as the source electrode 160s and the drain electrode 160d of the thin film transistor TFT and is formed of the same material as the source electrode 160s and the drain electrode 160d. However, the disclosure is not limited thereto. Any conductive layer may be used to form the auxiliary wiring 160a, and the auxiliary wiring 160a may be disposed on the same layer as the gate electrode 140 or the pixel electrode 210.

Referring to FIG. 6 with FIG. 2, the formation of the auxiliary wirings 160a1 to 160an includes formation of the first auxiliary wiring 160a1 and the second auxiliary wiring 160a2 separate from each other by the second distance.

After the auxiliary wiring 160a is disposed, the planarization layer 170 may be disposed on the auxiliary wiring 160a. In this regard, the planarization layer 170 may expose at least a portion of the auxiliary wiring 160a, and the exposed at least a portion of the auxiliary wiring 160a may electrically contact the opposite electrode 230. The conductive material layer 210a may be further disposed on the portion of the auxiliary wiring 160a that is exposed by the planarization layer 170. The material layer 210a of FIG. 6 may be disposed on the same layer as the pixel electrode 210.

Afterwards, referring to FIG. 6, the pixel-defining layer 180 is disposed on the pixel electrode 210 so as to expose at least a portion of the pixel electrode 210 that includes a central portion of the pixel electrode 210. In this regard, the pixel-defining layer 180 may expose at least a portion of the material layer 210a. Although, in the present embodiment, the material layer 210a is disposed on the auxiliary wiring 160a, and the pixel-defining layer 180 exposes at least a portion of the material layer 210a, the disclosure is not limited thereto. The material layer 210a may not be disposed on the auxiliary wiring 160a, and in this case, the pixel-defining layer 180 may directly expose at least a portion of the auxiliary wiring 160a.

Afterwards, the intermediate layer 221 and 222 and the emission layer 223 may be over the entire surface of the substrate 100 to cover the pixel-defining layer 180. Although not illustrated, the intermediate layer 221 and 222 may be integrally formed with each other on a plurality of pixels. For example, the first intermediate layer 221 is formed to cover the pixel-defining layer 180 and the pixel electrode 210, and then, the emission layer 223 may be formed so as to correspond to the pixel electrode 210. Afterwards, the second intermediate layer 222 may be formed to cover the emission layer 223 and the first intermediate layer 221.

For example, the first intermediate layer 221 includes an HIL and/or an HTL, and the second intermediate layer 222 may include an ETL and/or an EIL.

Figure 7:
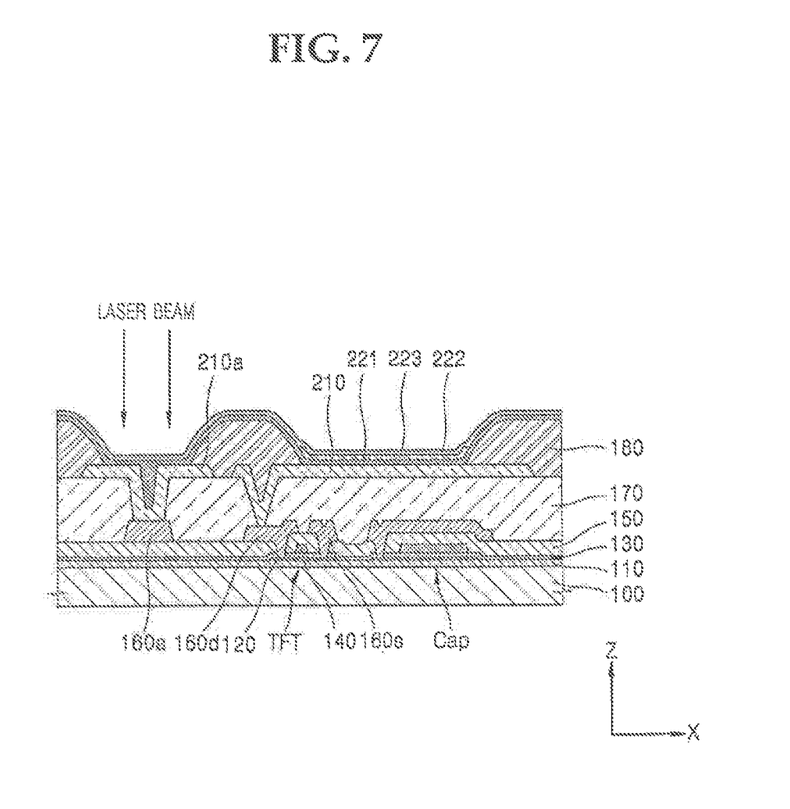
Figure 8:
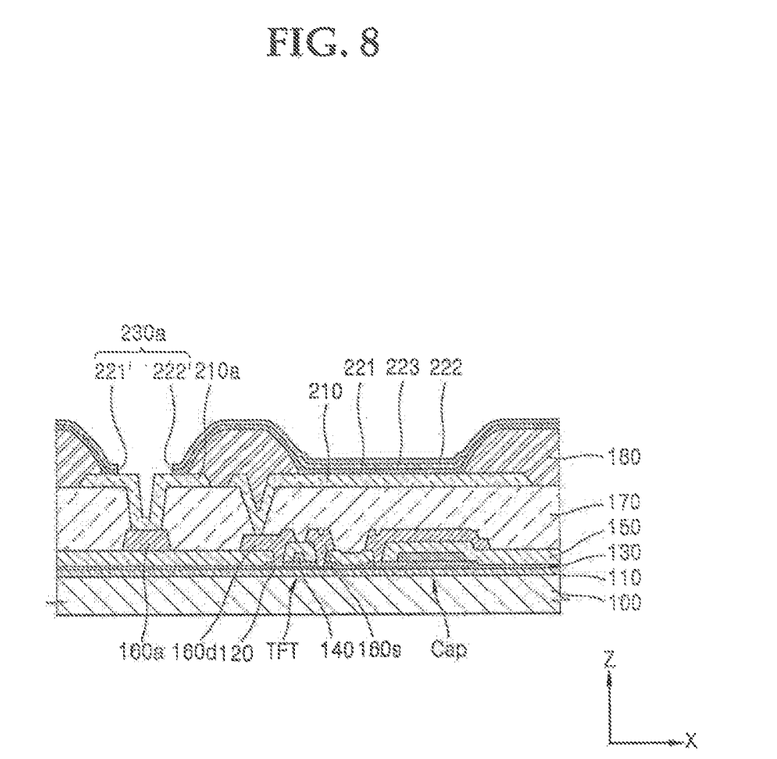

Afterwards, as illustrated in FIG. 8, a portion of the first intermediate layer 221 that is above the auxiliary wiring 160a and a portion of the second intermediate layer 222 that is above the auxiliary wiring 160a are removed to form the opening 221' in the first intermediate layer 221 and the opening 222' in the second intermediate layer 222, and thus, at least a portion of the auxiliary wiring 160a is exposed. For this, as illustrated in FIG. 7, a laser beam may be irradiated on the second intermediate layer 222, and thus, the opening 221' and the opening 222' may be respectively formed in the first intermediate layer 221 and the second intermediate layer 222 simultaneously (or concurrently).

The openings 230a formed by using such a method may be, as illustrated in FIG. 2, in the diagonal direction (direction A) crossing the first direction (y-axis direction) in which the auxiliary wirings 160a1 to 160an extend. The openings 230a may be shifted as much as a predetermined distance in the diagonal direction (direction A).

The formation of the openings 230a may include formation of the first opening 230a1 exposing at least a portion of the first auxiliary wiring 160a1 and the second opening 230a2 exposing at least a portion of the second auxiliary wiring 160a2. In this case, the second opening 230a2 may be shifted from the first opening 230a1 by a predetermined distance. In this regard, since the first auxiliary wiring 160a1 and the second auxiliary wiring 160a2 are separate from each other by the second distance, the second opening 230a2 may be shifted from the first opening 230a1 by the second distance. In this regard, the second distance may be the same as the first distance d or may be n times the first distance d. That is, when the second distance is the same as the first distance d, the second auxiliary wiring 160a2 may be right next to the first auxiliary wiring 160a1. When the second distance is n times the first distance d, the second auxiliary wiring 160a2 may not be right next to the first auxiliary wiring 160a1.

Referring to FIG. 2, the formation of the openings 230a may further include formation of the third opening 230a3 and the fourth opening 230a4 in addition to the first opening 230a1 and the second opening 230a2. The third opening 230a3 may be most adjacent to the first opening 230a1 in the second direction (x-axis direction) perpendicular to the first direction (y-axis direction). Similarly, the fourth opening 230a4 may be most adjacent to the second opening 230a2 in the second direction (x-axis direction) perpendicular to the first direction (y-axis direction). In this regard, a shape obtained by connecting respective vertices of the first opening 230a1, the second opening 230a2, the third opening 230a3, and the fourth opening 230a4 may be a parallelogram. That is, when the first opening 230a1 and the third opening 230a3 are parallel to each other in the second direction (x-axis direction), and the second opening 230a2 and the fourth opening 230a4 are also parallel to each other in the second direction (x-axis direction), the second opening 230a2 is shifted from the first opening 230a1 by a predetermined distance in the diagonal direction (direction A), and the fourth opening 230a4 is shifted from the third opening 230a3 by a predetermined distance in the diagonal direction (direction A).

When the first opening 230a1 and the second opening 230a2 are not in the diagonal direction (direction A) but consecutively in the first direction (y-axis direction) along a certain auxiliary wiring, for example, the first auxiliary wiring 160a1, current concentrates into the first auxiliary wiring 160a1. This degrades the performance of an auxiliary wiring formed to lower the IR drop of the opposite electrode 230. Accordingly, in the OLED display 1 according to an embodiment, when the openings 230a via which the auxiliary wirings 160a1 to 160an and the opposite electrode 230 may electrically contact each other are formed, the openings 230a may be shifted as much as a predetermined distance in the diagonal direction (direction A) and thus may be above different auxiliary wirings from each other. Accordingly, current may be prevented from concentrating into a certain auxiliary wiring.

Figure 9:
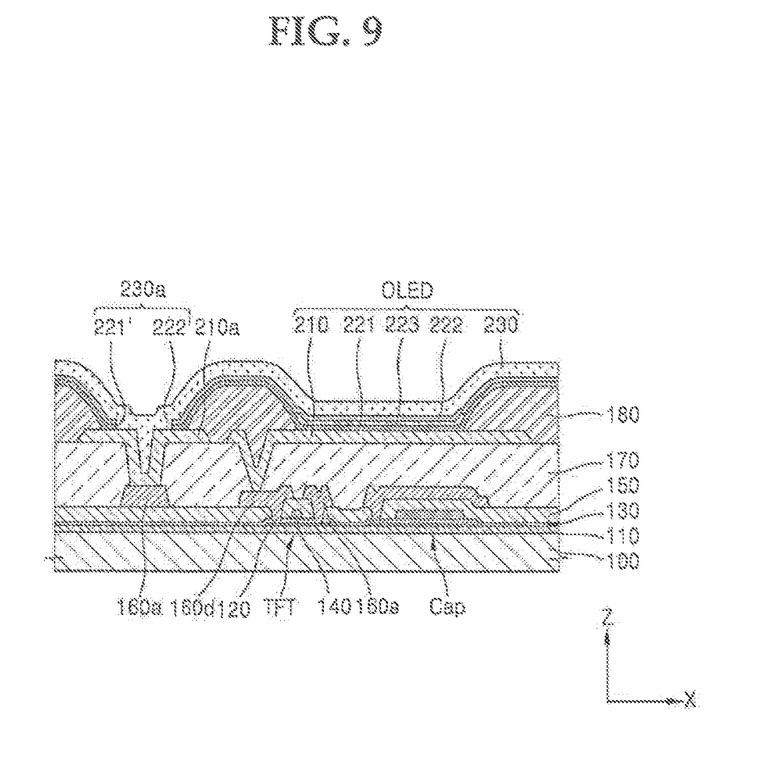

Next, as illustrated in FIG. 9, the opposite electrode 230 corresponding to the pixel electrode 210 and the auxiliary wiring 160a is formed so as to electrically contact the auxiliary wiring 160a via the opening 230a. The opposite electrode 230 may be formed as one body with respect to the plurality of pixels to cover a display area (active area). In this regard, the display area may refer to any area of the entire OLED display, from which light may be emitted. For example, the display area may refer to all areas except an edge of the OLED display, where a controller or the like is disposed. When there is no dead area over the entire surface of the OLED display, the entire surface of the OLED display may be referred to as the display area. The opposite electrode 230 may contact an electrode power supply line outside of the display area and receive an electrical signal from the electrode power supply line.

According to at least one of the disclosed embodiments, an OLED display that is easy to manufacture and has high emission stability and a method of manufacturing the OLED display may be provided. However, such an effect does not pose a limitation on the scope of the described technology.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A display comprising:
a substrate;
an insulating layer disposed on the substrate;
a first electrode disposed on the insulating layer, wherein a portion of the first electrode extends through the insulating layer via a first contact hole in the insulating layer to contact a drain electrode;
a conductive layer disposed on the insulating layer on a same layer as the first electrode and spaced apart from the first electrode, wherein a portion of the conductive layer extends through the insulating layer via a second contact hole in the insulating layer to contact a wiring located on a same layer as the drain electrode;
a sub-wiring disposed below and crossing the wiring, wherein the sub-wiring is electrically connected to the wiring;
a pixel-defining layer having a first discontinuous portion exposing a part of the first electrode, and a second discontinuous portion exposing a part of the conductive layer;
an intermediate layer disposed over the pixel-defining layer and surrounding a third discontinuous portion overlapping the second discontinuous portion, wherein the intermediate layer is in direct contact with both the conductive layer and the first electrode and is electrically connected with the drain electrode via the first electrode and with the wiring via the conductive layer; and
a second electrode disposed over the intermediate layer and facing the first electrode, wherein a first portion of the second electrode is disposed over the first electrode, wherein a second portion of the second electrode extends below an upper surface of the insulating layer via the second contact hole in the insulating layer and via the third discontinuous portion, and wherein the second portion of the second electrode has a same material composition as the first portion of the second electrode and has a thickness different from the first portion;
wherein the conductive layer is electrically connected to the second electrode through the third discontinuous portion and extends below the upper surface of the insulating layer via the second contact hole.

2. The display of claim 1, further comprising:
a transistor above the substrate, the transistor including a semiconductor layer, a gate electrode, and an electrode layer over the gate electrode, wherein the first electrode is electrically connected to the transistor;
wherein the insulating layer is interposed between the electrode layer and the first electrode, wherein the wiring extends in a first direction, and wherein the conductive layer is disposed on the wiring.

3. The display of claim 2,
wherein the wiring is positioned on a same layer as the electrode layer, and
the sub-wiring is positioned on a same layer as the gate electrode and includes a same material as the gate electrode.

4. The display of claim 1,
wherein the wiring has a width less than a width of the third discontinuous portion,
the conductive layer has a width greater than the third discontinuous portion, and
a distance between the conductive layer and the first electrode is less than a distance between the wiring and the drain electrode.

5. The display of claim 1,
wherein the conductive layer includes a same material as the first electrode.

6. The display of claim 1,
wherein the intermediate layer comprises an emission layer between the first electrode and the second electrode, the emission layer being patterned to correspond to the first electrode.

7. The display of claim 6,
wherein the intermediate layer further comprises a first intermediate layer interposed between the emission layer and the first electrode, and the intermediate layer further comprises a second intermediate layer interposed between the emission layer and the second electrode.

8. The display of claim 1,
wherein a portion of the intermediate layer that is adjacent to the third discontinuous portion is configured to be transformed by heat.

9. The display of claim 1,
wherein the intermediate layer has the third discontinuous portion for electrically connecting the conductive layer to the second electrode, and
the intermediate layer is spaced apart from the insulating layer by the conductive layer.

10. The display of claim 7,
wherein the third discontinuous portion comprises a first sub-discontinuous portion in the first intermediate layer and a second sub-discontinuous portion in the second intermediate layer.

11. The display of claim 2,
wherein the wiring includes a same material as the electrode layer.

12. A display comprising:
a substrate;
a plurality of wirings disposed on the substrate, the plurality of wirings extending in a first direction and being separated from each other in a second direction crossing the first direction;
an insulating layer disposed on the substrate and the plurality of wirings;
a plurality of first electrodes over the insulating layer on the substrate, the first electrodes being separated from each other in the second direction, wherein a portion of a first electrode of the plurality of first electrodes extends through the insulating layer via a first contact hole in the insulating layer to contact a drain electrode disposed on a same layer as of the plurality of wirings;
a plurality of contact portions disposed on the insulating layer on a same layer as the plurality of first electrodes and including a contact portion spaced apart from the first electrode in the second direction, wherein a portion of the contact portion extends through the insulating layer via a second contact hole in the insulating layer to contact an auxiliary wiring of the plurality of wirings, and wherein first adjacent ones of the plurality of contact portions are spaced apart in the first direction, separated by at least two of the plurality of first electrodes, and second adjacent ones of the plurality of contact portions are spaced apart in the first direction, separated by at least two of the plurality of first electrodes, and shifted a predetermined distance in the second direction to be aligned in a diagonal direction;
a second electrode disposed over the plurality of first electrodes and the contact portion, wherein a first portion of the second electrode is disposed over the first electrode, wherein a second portion of the second electrode extends below an upper surface of the insulating layer via the second contact hole in the insulating layer, and wherein the second portion of the second electrode has a same material composition as the first portion of the second electrode; and
an intermediate layer disposed below the second electrode, wherein the intermediate layer is in direct contact with both the contact portion and the plurality of first electrodes and is electrically connected with the drain electrode via the first electrode and with the auxiliary wiring via the contact portion,
wherein the second electrode is electrically connected to the plurality of wirings through the plurality of contact portions.

13. The display of claim 12,
wherein the plurality of contact portions are disposed in a shape of a parallelogram.

14. The display of claim 12,
wherein the contact portion is disposed between the first electrode of the plurality of first electrodes and a second first electrode of the plurality of first electrodes closest to the first electrode in the second direction,
the contact portion is not located between the first electrode and another first electrode closest to a third direction opposite to the second direction.

15. The display of claim 12,
wherein the plurality of contact portions include a first contact portion at a first interval in the second direction crossing the first direction with respect to one of the plurality of first electrodes and a second contact portion at a second interval different from the first interval in a third direction opposite to the second direction.

16. The display of claim 15,
wherein the first interval is defined by the plurality of contact portions being disposed on the auxiliary wiring and the second interval is defined by the plurality of contact portions between disposed between a sub-wiring disposed perpendicular to the auxiliary wiring.

17. The display of claim 12,
wherein the plurality of first electrodes include a first electrode pattern, a second electrode pattern, and a third electrode pattern disposed to be spaced apart from each other at a first interval in the second direction intersecting the first direction,
at least one of the plurality of contact portions is between the first electrode pattern and the second electrode pattern, and
the at least one of the plurality of contact portions is not between the second electrode pattern and the third electrode pattern.

18. The display of claim 12,
wherein among the plurality of first electrodes, one first electrode and another first electrode closest to each other in a second direction intersecting the first direction are disposed at a first interval, and
among the plurality of contact portions, one contact portion and another contact portion closest to each other in the second direction are at a second interval greater than the first interval.

19. The display of claim 12, further comprising:
a pixel-defining layer having a plurality of first discontinuous portions by exposing the first electrodes, and a plurality of second discontinuous portions by exposing the auxiliary wiring of the plurality of wirings;
wherein, with respect to a first discontinuous portion of one of the first discontinuous portions, a second discontinuous portion of one of the second discontinuous portions closest to the first discontinuous portion in a second direction crossing the first direction is at a first interval from the first discontinuous portion, another first discontinuous portion of one of the first discontinuous portions that is closest to the first discontinuous portion in a third direction opposite to the second direction is at a second interval greater than the first interval from the first discontinuous portion.

20. The display of claim 19,
wherein the second electrode is in contact with the auxiliary wiring of the plurality of wirings through the plurality of second discontinuous portions.

21. The display of claim 12,
wherein the plurality of wirings includes a first wire, a second wire, and a third wire disposed closest to each other at same interval,
the plurality of contact portions include a first contact portion, a second contact portion, and a third contact portion exposing the first wire, the second wire, and the third wire, respectively;
wherein the first contact portion, the second contact portion, and the third contact portion are shifted in a direction diagonal to the first direction.

* * * * *